United States Patent
Fu et al.

(10) Patent No.: US 10,203,540 B2
(45) Date of Patent: Feb. 12, 2019

(54) DISPLAY PANEL AND DISPLAY DEVICE

(71) Applicant: BOE Technology Group Co., Ltd., Beijing (CN)

(72) Inventors: Chengyu Fu, Beijing (CN); Wenbo Li, Beijing (CN); Chunwei Wu, Beijing (CN); Dan Wang, Beijing (CN); Chuanxiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/323,138

(22) PCT Filed: Feb. 29, 2016

(86) PCT No.: PCT/CN2016/074811
§ 371 (c)(1),
(2) Date: Dec. 30, 2016

(87) PCT Pub. No.: WO2016/188168
PCT Pub. Date: Dec. 1, 2016

(65) Prior Publication Data
US 2017/0139264 A1    May 18, 2017

(30) Foreign Application Priority Data

May 22, 2015  (CN) .......................... 2015 1 0264725

(51) Int. Cl.
*G02F 1/1339* (2006.01)
*G02F 1/1335* (2006.01)
(Continued)

(52) U.S. Cl.
CPC ........ *G02F 1/133512* (2013.01); *G06F 3/147* (2013.01); *H01L 27/1292* (2013.01);
(Continued)

(58) Field of Classification Search
None
See application file for complete search history.

(56) References Cited

U.S. PATENT DOCUMENTS 8,988,643 B2    3/2015  Yang et al.
8,993,043 B2 *  3/2015  Yoo .................... G02B 5/201
                                                    427/66
(Continued)

FOREIGN PATENT DOCUMENTS

CN         1616991 A       5/2005
CN       103091883 A       5/2013
(Continued)

OTHER PUBLICATIONS

English translation of International Search Report and Written Opinion for International Application No. PCT/CN2016/074811, dated May 31, 2016, 7 pages total.
(Continued)

*Primary Examiner* — Richard H Kim
(74) *Attorney, Agent, or Firm* — Westman, Champlin & Koehler, P.A.

(57) ABSTRACT

A display panel and a display device are provided by embodiments of the present disclosure, relating to a field of display technology. The display panel comprises a pixel array substrate and an opposite substrate which is located opposite to the pixel array substrate, the pixel array substrate comprising a pixel array and a substrate on which the pixel array is arranged; the pixel array comprises a plurality of columns of sub-pixels, a light-shielding wall being provided between any two adjacent columns of sub-pixels; and a first length of the light-shielding wall in a direction perpendicular to the substrate is smaller than a spacing between the pixel array substrate and the opposite substrate. By providing the light-shielding wall which is enabled to shield sub-pixels(s) so as to decrease a visual range of the display panel, between
(Continued)

any two adjacent columns of sub-pixels within the pixel array, a peep-proof aim can be achieved by the embodiments of the present disclosure. And the first length of the light-shielding wall in a direction perpendicular to the substrate is smaller than a spacing between the pixel array substrate and the opposite substrate, such that neither the thickness of the display panel nor that of the display apparatus can be increased by providing the light-shielding wall.

13 Claims, 7 Drawing Sheets

(51) Int. Cl.
G06F 3/147 (2006.01)
H01L 27/12 (2006.01)
H01L 27/32 (2006.01)
H01L 51/52 (2006.01)

(52) U.S. Cl.
CPC ...... *H01L 27/3218* (2013.01); *H01L 27/3272* (2013.01); *H01L 51/5284* (2013.01); *G02F 2201/52* (2013.01)

(56) References Cited

U.S. PATENT DOCUMENTS

| | | | |
|---|---|---|---|
| 9,429,751 B2 | 8/2016 | Wang et al. | |
| 9,507,188 B2 | 11/2016 | Qin et al. | |
| 9,557,559 B2 | 1/2017 | Wang et al. | |
| 2002/0033927 A1* | 3/2002 | Mun | G02F 1/133707 349/156 |
| 2007/0193508 A1* | 8/2007 | Komatsu | B05C 5/00 118/300 |
| 2008/0002125 A1* | 1/2008 | Kim | G02F 1/136209 349/140 |
| 2008/0043160 A1* | 2/2008 | Park | G02F 1/133555 349/38 |
| 2008/0204848 A1* | 8/2008 | Mathea | G02F 1/167 359/266 |
| 2009/0103023 A1* | 4/2009 | Chen | B41M 3/003 349/106 |
| 2012/0268700 A1* | 10/2012 | Shu | G03F 7/0007 349/106 |
| 2013/0162924 A1 | 6/2013 | Sahouani et al. | |
| 2014/0085578 A1* | 3/2014 | Gu | G02F 1/133514 349/106 |
| 2016/0011411 A1 | 1/2016 | Wang et al. | |

FOREIGN PATENT DOCUMENTS

| | | | |
|---|---|---|---|
| CN | 103097951 A | 5/2013 | |
| CN | 203275830 U | 11/2013 | |
| CN | 103605237 A | 2/2014 | |
| CN | 103792703 A | 5/2014 | |
| CN | 104090377 A | 10/2014 | |
| CN | 104090378 A | 10/2014 | |
| CN | 104808410 A | 7/2015 | |
| JP | 2002318381 | * 10/2002 | ............... G02B 5/20 |
| JP | 2002318381 A | 10/2002 | |
| JP | 2013-190608 A | 9/2013 | |

OTHER PUBLICATIONS

International Search Report and Written Opinion of International Application No. PCT/CN2016/074811, dated May 31, 2016, 7 pages.
English translation of Box No. V of the Written Opinion for the International Searching Authority for International Application No. PCT/CN2016/074811, 2 pages.
First Office Action from Chinese Patent Application No. 201510264725.6, dated May 31, 2017, 11 pages.
Second Office Action, including Search Report, for Chinese Patent Application No. 201510264725.6, dated Mar. 30, 2018, 11 pages.

* cited by examiner

DISPLAY PANEL AND DISPLAY DEVICE

CROSS-REFERENCE TO RELATED APPLICATION

This application is a 371 National Stage application of International Application No. PCT/CN2016/074811, filed Feb. 29, 2016, which published as WO 2016/188168 A1 on Dec. 1, 2016, which claims priority to Chinese Patent Application No. 201510264725.6 filed on May 22, 2015 in the State Intellectual Property Office of China, the whole disclosure of which is incorporated herein by reference.

BACKGROUND OF THE INVENTION

Field of the Invention

Embodiments of the present disclosure relate to the technical field of display, and in particular to a display panel and a display device.

Description of the Related Art

In recent year, with rapid development of display technology, "peep-proof" performance of display apparatus is increasingly paid much more attention to, and it has become an urgent problem to be solved how to effectively ensure peep-proof security of display devices and to ensure privacy of the information displayed by the display devices.

In order to solve the peep-proof problem so as to ensure security of the displayed information, by way of example, a conventional solution in the field of display device is to apply a peep-proof film onto a display panel, the peep-proof film typically comprising a protective film layer, a PET (Polyethylene terephthalate) layer, an adhesive layer and a shutter film layer. Taking the shutter film layer which functions as the peep-proof film for example, the shutter film layer comprises a plurality of optical films parallel to one another, with an angle being provided between each optical film and the display panel. The optical film is capable of shielding the display panel and decreasing a display angle thereof, thus decreasing an visual range of the display panel, such that any user located within the visual range of the display panel may be enabled to observe the information displayed by the display panel while other user located outside the visual range may be incapable of viewing such information; i.e., the peep-proof purpose is achieved.

During the process of implementing the exemplary embodiments of the disclosure, at least following problems are found to be existing in the conventional peep-proof technology in the prior art, e.g., the peep-proof film is typically provided with a thickness such that a total thickness of the display apparatus may be increased in the case that the peep-proof film is applied onto the display panel.

SUMMARY OF THE INVENTION

Embodiments of the present disclosure have been made, by providing a display panel and a display device such that an effective peep-proof effect may be obtained while the thickness of the display panel and the display device may be decreased simultaneously.

In order to achieve above aims, the exemplary embodiments of the present application are accomplished through the following technical solutions:

According to a first aspect of the exemplary embodiment of the present application, there is provided a display panel, the display panel comprising a pixel array substrate and an opposite substrate which is located opposite to the pixel array substrate, the pixel array substrate comprising a pixel array and a substrate on which the pixel array is arranged; the pixel array comprises a plurality of columns of sub-pixels, a light-shielding wall being provided between any two adjacent columns of sub-pixels; and a first length of the light-shielding wall in a direction perpendicular to the substrate is smaller than a spacing between the pixel array substrate and the opposite substrate.

According to an exemplary embodiment, the first length of the light-shielding wall is at least not less than a first length of its adjacent sub-pixel in the direction perpendicular to the substrate.

According to an exemplary embodiment, a continuous light-shielding wall is provided as the light-shielding wall which is continuously disposed, between any two adjacent columns of sub-pixels within the pixel array.

According to an exemplary embodiment, for each continuous light-shielding wall, it is configured to be aligned with a prescribed column within the pixel array which is one column configured to be provided with a larger second length in a longitudinal direction of the substrate, within two columns located in vicinity of the light-shielding wall at both sides thereof respectively.

According to an exemplary embodiment, a plurality of light-shielding walls are provided as light-shielding walls spaced apart, between any two adjacent columns of sub-pixels within the pixel array.

According to an exemplary embodiment, for each light-shielding wall, it is configured to be aligned with prescribed sub-pixels, which are sub-pixels configured to have a largest second length in a longitudinal direction of the substrate, within at least one sub-pixel located at each of both sides in vicinity of the light-shielding wall respectively.

According to an exemplary embodiment, the first length of the light-shielding wall is configured to be less than 50 um.

According to an exemplary embodiment, for each light-shielding wall, a spacing of 1 to 25 um is provided between the sub-pixels in vicinity of the light-shielding wall and the light-shielding wall.

According to an exemplary embodiment, the first length of each sub-pixel within the pixel array is configured to be 0.05 to 5 um.

According to an exemplary embodiment, a third length of each sub-pixel within the pixel array in a transverse direction of the substrate is configured to be 1 to 50 um.

According to an exemplary embodiment, the light-shielding wall is a Black Matrix wall.

According to an exemplary embodiment, the light-shielding wall is formed by ink-jet printing onto the substrate.

According to another aspect of the exemplary embodiment of the present application, there is provided a display device, which comprises the display panel according to the first aspect.

As an exemplary embodiment, by providing the light-shielding wall which is enabled to shield sub-pixels(s) so as to decrease a visual range of the display panel, between any two adjacent columns of sub-pixels on the pixel array substrate, a peep-proof aim may be achieved by the embodiments of the present disclosure. And the first length of the light-shielding wall in a direction perpendicular to the substrate is smaller than a spacing between the pixel array substrate and the opposite substrate, such that neither the thickness of the display panel nor that of the display apparatus may be increased by providing the light-shielding wall.

BRIEF DESCRIPTION OF THE DRAWINGS

The above and other features and advantages of the present disclosure will become more apparent and a more comprehensive understanding of the present disclosure may be obtained, by describing in detail exemplary embodiments disclosure thereof with reference to the accompanying drawings, in which.

DETAILED DESCRIPTION OF PREFERRED EMBODIMENTS OF THE INVENTION

Figure 1:
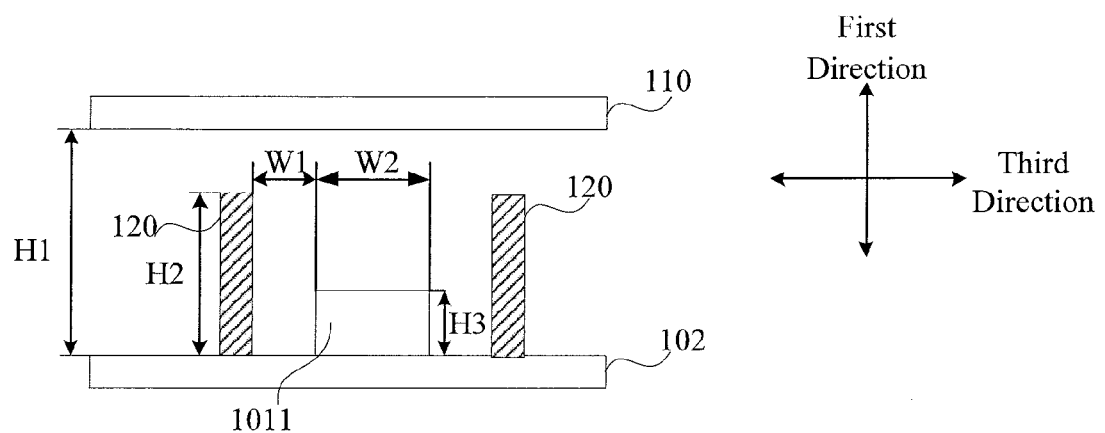
FIG. 1 illustrates a schematic cross section view of a display panel, according to an exemplary embodiment of the disclosure.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective thickness and shape of each layer of film are only intended to exemplarily illustrate the contents of the disclosure, rather than to demonstrate the practical dimension or proportion of the peep-proof display panel, i.e., the display screen and the layers therewith.

Before detailed descriptions of the exemplary embodiments of the disclosure, lengths in various directions involved in the exemplary embodiments of the disclosure are explained and set forth above all:

In the exemplary embodiments of the disclosure, a substrate in a pixel array substrate is used as a reference; and on the basis of such reference, a direction perpendicular to the plane of the substrate is specified as a first direction, a longitudinal direction in which the substrate extends in the plane thereof is specified as a second direction, and a transverse direction which is transvers to the second direction in which the substrate extends longitudinally in the plane thereof is specified as a third direction. Correspondingly, a length in the first direction is referred to as a first length, a length in the second direction is referred to as a second length, and a length in the third direction is referred to as a third length.

For example, a first length of a sub-pixel refers to a thickness of the sub-pixel on the substrate; a second length of a sub-pixel refers to a sub-pixel height of the sub-pixel in a longitudinal direction of the substrate within the plane of the pixel array substrate; and a third length of a sub-pixel refers to a sub-pixel width of the sub-pixel in a transverse direction of the substrate within the plane of the pixel array substrate.

A display panel and a display device are provided by exemplary embodiments of the disclosure, and are to be set forth in details below in connection with the drawings.

According to a general technical concept of the present disclosure, there is provided a display panel which comprises a pixel array substrate and an opposite substrate which is located opposite to the pixel array substrate.

Among others, the opposite substrate is for example a cover plate or a color filter substrate. For different types of display panels, their corresponding opposite substrates may be of a same type in some embodiments, or may be of different types in other embodiments, and the exemplary embodiments of the disclosure may not make specific definitions or impose specific restrictions thereon. By way of example, the display panel is for example a liquid crystal display panel or an OLED (Organic Light-Emitting Diode) display panel. In the case that the display panel is chosen to be a liquid crystal display panel, the opposite substrate is a color filter substrate, for example; and in the case that the display panel is chosen to be an OLED display panel, the opposite substrate is for example a cover plate or a color filter substrate, for example.

By way of example, the pixel array substrate comprises a substrate and a pixel array which is disposed on the substrate and configured to comprise a plurality of columns of sub-pixels, the plurality of columns of sub-pixels being arranged parallel to one another for example, and each column of sub-pixels being configured to comprise a plurality of sub-pixels which are arranged to be aligned with one another.

By way of example, sub-pixels within the pixel array are for example arranged in several manners, for example. The sub-pixels within an identical column are configured to be provided with an identical color in some embodiments, while to be provided with different colors in other embodiments; and sub-pixels within adjacent columns are configured to be provided with an identical color in some embodiments, while to be provided with different colors in other embodiments; and specific numbers of sub-pixels contained in different columns are configured to be identical in some embodiments, while to be different in other embodiments; and edges of different columns are configured to be aligned with one another in some embodiments, while to be not aligned with one another in other embodiments; and the exemplary embodiments of the disclosure may not make specific definitions or impose specific restrictions on above aspects. For example, sub-pixels within the pixel array are arranged in a RGB-Stripe layout, or in a S-RGB layout, or in a Pentile layout.

Each of the sub-pixels within the pixel array is configured to be provided with an identical length in various directions in some embodiments, while to be provided with different lengths in various directions in other embodiments, specifically depending on design requirements and process conditions of products, and the exemplary embodiments of the disclosure may not make specific definitions or impose specific restrictions thereon. According to exemplary embodiments of the disclosure, in the pixel array, the first length of each sub-pixel (i.e., pixel thickness) is identical and the third length of each sub-pixel (i.e., pixel width) is also identical. Furthermore, according to exemplary embodiments of the disclosure, the first length of each sub-pixel is for example 0.05 to 5 um, while the third length of each sub-pixel is for example 1 to 50 um.

In an embodiment of the disclosure, the light-shielding wall is provided between any two adjacent columns of sub-pixels within the pixel array, which light-shielding wall is enabled to shield sub-pixels(s) within the pixel array so as to decrease a visual range of the display panel. In order to ensure shielding effect of the light-shielding wall onto the sub-pixel(s), the first length of the light-shielding wall is configured to be for example larger than the first length of sub-pixels within the pixel array.

In practical applications, a spacing is defined between the pixel array substrate and the opposite substrate within the display panel, such that in the case that a light-shielding wall is provided on the pixel array substrate, the first length of the light-shielding wall, i.e., the thickness of the light-shielding wall in a direction perpendicular to the pixel array substrate is smaller than the spacing between the pixel array substrate and the opposite substrate, such that the light-shielding wall may be interposed between the pixel array substrate and the opposite substrate. For example, in the case that the spacing between the pixel array substrate and the opposite substrate is 50 um, then the first length of the light-shielding wall is less than 50 um.

In the case that the light-shielding wall shields the sub-pixel(s), the light-shielding wall only occupies a space where there is an existing spacing between the pixel array substrate and the opposite substrate in an interposition manner, without increasing the spacing therebetween additionally, and in turn without increasing the thickness of the display panel.

By way of example, the smaller the spacing between the light-shielding wall and a sub-pixel is arranged in vicinity of the light-shielding wall, the smaller the visual angle of the sub-pixel becomes; and the greater the spacing between a sub-pixel is arranged in vicinity of the light-shielding wall and the light-shielding wall, the larger the visual angle of the sub-pixel becomes. The spacing between the light-shielding wall and a sub-pixel arranged in vicinity of the light-shielding wall is for example determined in accordance with the visual angle requirements of the sub-pixels and process conditions, and spacing between sub-pixels of adjacent columns within the pixel array, and the exemplary embodiments of the disclosure may not make specific definitions or impose specific restrictions thereon. According to embodiments of the disclosure, the spacing between the light-shielding wall and a sub-pixel arranged in vicinity of the light-shielding wall is 1 to 25 um. For example, the third length of the light-shielding wall is determined in accordance with respective spacing between the light-shielding wall and either of two sub-pixels arranged in vicinity of the light-shielding wall and the visual angle requirements of the sub-pixels, and the exemplary embodiments of the disclosure may not make specific definitions or impose specific restrictions thereon.

In order to ensure a consistent visual angle of the sub-pixels at different positions of the display panel, the first length, the second length and the third length of the plurality of the light-shielding walls disposed on the substrate are for example configured to be identical, and respective spacing between the light-shielding wall and either of two sub-pixels arranged in vicinity of the light-shielding wall is for example configured to be identical.

FIG. 1 illustrates a schematic cross section view of a display panel, according to an exemplary embodiment of the disclosure. Referring to FIG. 1, the display panel comprises a pixel array substrate at bottom thereof and an opposite substrate 110 which is located opposite to and spaced apart from the pixel array substrate, and the pixel array substrate comprises a substrate 102 and a pixel array disposed on the substrate 102, with a light-shielding wall 120 being provided between any two adjacent columns of sub-pixels 1011 within the pixel array. The first direction and the third direction is illustrated in FIG. 1, wherein the first length of the sub-pixel is referred to as H3, the third length of the sub-pixel is referred to as W2, and the spacing between the sub-pixel and the light-shielding wall is referred to as W1. The spacing between the pixel array substrate and the opposite substrate is referred to as H1, and the first length of the light-shielding wall is referred to as H2; in order to ensure that the thickness of the display panel is not to be increased, the first length H2 is configured to be smaller than the spacing H1 between the pixel array substrate and the opposite substrate. Moreover, in order to ensure the light-shielding effect of the light-shielding wall onto the sub-pixel(s) located in vicinity thereof, then the first length H2 of the light-shielding wall is typically larger than the first length H3 of the sub-pixel(s); and more specifically, the first length H2 of the light-shielding wall is at least not less than the first length H3 of the sub-pixel(s).

It should be noticed that, FIG. 1 is only an exemplary illustration of schematic position definition of the first and the third lengths of the sub-pixel(s) and the first and the third lengths of the light-shielding wall, and comparison relationships relative to one another, rather than intending to define or restrict specific dimensions of the various lengths and specific proportional relationships thereamong.

Figure 2:
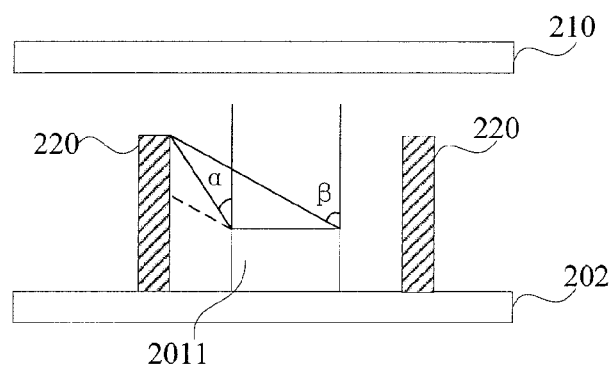
FIG. 2 illustrates a schematic view of a visual angle of a display panel, according to an exemplary embodiment of the disclosure.

FIG. 2 illustrates a schematic view of a visual angle of a display panel, according to an exemplary embodiment of the disclosure. Referring to FIG. 2, the display panel comprises a pixel array substrate at bottom thereof and an opposite substrate 210 which is located opposite to and spaced apart from the pixel array substrate, and the pixel array substrate comprises a substrate 202 and a pixel array disposed on the substrate 202, with a light-shielding wall 220 being provided between any two adjacent columns of sub-pixels 2011 within the pixel array. Then an interconnection line formed between one edge vertice which is located within an upper surface of the light-shielding wall 220 and is closest to the adjacent sub-pixel and another edge vertice which is located within an upper surface of the adjacent sub-pixel and is closest to the light-shielding wall 220 intersects an orthogonal direction relative to the substrate so as to form an angle α which is an optimal visual angle of the sub-pixel 2011; while another interconnection line formed between the one edge vertice which is located within an upper surface of the light-shielding wall 220 and is closest to the adjacent sub-pixel and another edge vertice which is located within an upper surface of the adjacent sub-pixel and is farthest away from the light-shielding wall 220 intersects the orthogonal direction relative to the substrate so as to form an angle β which is a maximal visual angle of the sub-pixel 2011. When an user is located within a range delimited by the optimal visual angle α, since the color lights displayed by the sub-pixel 2011 may be directly projected into human eyes, rather than being shielded by the light-shielding wall 220, then a luminance of the visual information coming from the sub-pixel which is received by the user is essentially an original luminance of the sub-pixel 2011; and when an user is located within a range delimited by the maximal visual angle β but outside the optimal visual angle α, then a portion of the color lights displayed by the sub-pixel 2011 may be shielded by the light-shielding wall 220, as illustrated by a dotted line in FIG. 2, due to the shielding effect of the light-shielding wall 220, the visual angle, then in the case that the user's visual angle falls within an angle range which is larger than the optimal visual angle α but smaller than or equal to the maximal visual angle β, the luminance of light received by eye which is displayed by the sub-pixel and carries visual information is rendered smaller than the original luminance emitted by the pixel 2011 itself.

In the prior art, when a peep-proof film is applied on to the display panel e.g., in an adhesive way, not only the thickness of the display panel is increased but also the luminance thereof is decreased, then the luminance of light received by eye which carries visual information may be decreased no matter where the user is located at any position within the visual range of the display panel, only differing in that, depending on different positions of user's eyes relative to the display panel, the luminance of light received by human eyes which is diminished/attenuated through the peep-proof film from the display panel may vary. However, in the embodiments of the disclosure, the light-shielding wall is provided on the pixel array substrate, such that the luminance of the sub-pixel(s) may not be decreased in the case that the visual angle of the user falls within the optimal visual angle of the sub-pixel(s), i.e., the luminance of the observed information may also not be decreased when the user is located with the optimal visual angle.

According to embodiments of the disclosure, the light-shielding wall is chosen to be a BM (Black Matrix) wall, or a light-shielding wall of other material(s). The light-shielding wall is for example formed by ink-jet printing onto the substrate, or by other methods onto the substrate, and the exemplary embodiments of the disclosure may not make specific definitions or impose specific restrictions thereon.

By way of example, in an embodiment, the light-shielding wall disposed between any two adjacent columns of sub-pixels within the pixel array is for example essentially a continuous light-shielding wall in an embodiment; and may also be, for example, a plurality of light-shielding walls which are arranged to be spaced apart in other embodiments, and the exemplary embodiments of the disclosure may not make specific definitions or impose specific restrictions thereon.

In the case that the light-shielding wall disposed between any two adjacent columns of sub-pixels within the pixel array is a continuous light-shielding wall, the continuous light-shielding wall is configured to align with a prescribed column within the pixel array. The prescribed column is one column configured to adjacent to the light-shielding wall within the pixel array; or else is one column configured to be provided with a larger second length (i.e., sub-pixel height), within two columns located in vicinity of the light-shielding wall at both sides thereof respectively, within the pixel array; and the exemplary embodiments of the disclosure may not make specific definitions or impose specific restrictions thereon. Among others, the continuous light-shielding wall aligns with the prescribed column; in other words, in the second direction, an upper edge of the continuous light-shielding wall is aligned with an upper edge of first sub-pixel of the prescribed column, and a lower edge of the continuous light-shielding wall is aligned with a lower edge of the last sub-pixel of the prescribed column.

In the case that the light-shielding wall disposed between any two adjacent columns of sub-pixels within the pixel array are a plurality of light-shielding wall which are arranged to be spaced apart, for each light-shielding wall, it is configured to be align with prescribed sub-pixels. The prescribed sub-pixels are at least one sub-pixel configured to adjacent to the light-shielding wall within the pixel array; or else are sub-pixels at single side which are configured to have a largest second length (i.e., sub-pixel height), within at least one sub-pixel located at each of both sides in vicinity of the light-shielding wall respectively, within the pixel array; and the exemplary embodiments of the disclosure may not make specific definitions or impose specific restrictions thereon. Among others, the light-shielding wall aligns with the prescribed sub-pixels; in other words, in the second direction, an upper edge of the continuous light-shielding wall is aligned with an upper edge of the prescribed sub-pixels, and a lower edge of the continuous light-shielding wall is aligned with a lower edge of the prescribed sub-pixel(s).

It should be noticed that, the embodiments of the disclosure only set forth by taking the light-shielding wall between any two adjacent columns of sub-pixels for example; however, in practical application, the light-shielding wall is provided for example outside the pixel array, i.e., the light-shielding walls are both provided at the outside of the first column of the pixel array and at the outside of the last column of the pixel array.

In the case that the light-shielding wall is provided at the outside of the pixel array, e.g., by providing a continuous light-shielding wall, or a plurality of light-shielding walls spaced apart as in other examples. Moreover, in the case that the continuous light-shielding wall is provided, the continuous light-shielding wall is for example configured to align with columns located in vicinity of the continuous light-shielding wall in some examples; but is alternatively configured to align with another light-shielding wall which is provided between any two adjacent columns of sub-pixels within the pixel array, rather than configured to align with columns located in vicinity thereof, in other examples. And in the case that a plurality of light-shielding walls which are space apart are provided, each of the light-shielding walls is for example configured to align with sub-pixels located in vicinity of the continuous light-shielding wall in some examples; but is alternatively configured to align with another light-shielding wall which is provided between any two adjacent columns of sub-pixels within the pixel array, rather than configured to align with sub-pixels located in vicinity thereof, in other examples.

As far as the pixel arrays in different arrangements are concerned, located positions of their light-shielding walls may for example vary.

Figure 3:
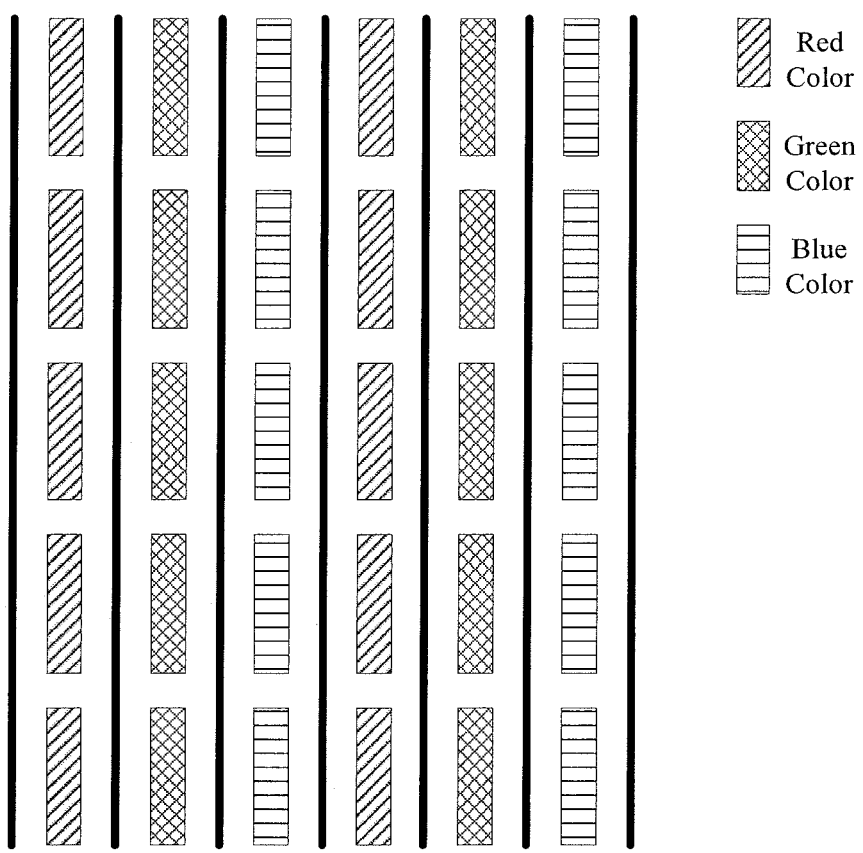
FIG. 3 illustrates a schematic view of a located position of a light-shielding wall, according to an exemplary embodiment of the disclosure.

Taking a pixel array arranged in a RGB-Stripe layout for example, the provided light-shielding wall is illustrated in FIG. 3. Referring to FIG. 3, within the pixel array, a continuous light-shielding wall is provided between any two adjacent columns of sub-pixels and is aligned with each column of the two adjacent columns of the pixel array. The provided light-shielding wall is also illustrated in FIG. 4.

Figure 4:
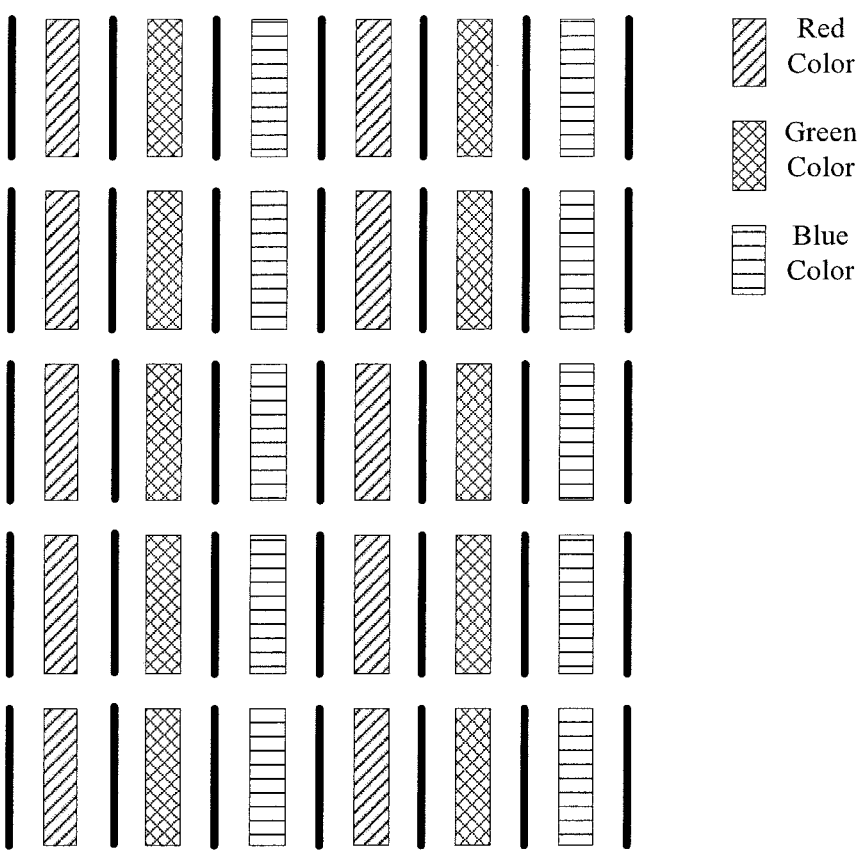
FIG. 4 illustrates a schematic view of a located position of a light-shielding wall, according to an exemplary embodiment of the disclosure.

Referring to FIG. 4, within the pixel array, a plurality of light-shielding walls which are arranged to be spaced apart are provided between any two adjacent columns of sub-pixels, each of the light-shielding walls being aligned with adjacent sub-pixels.

Figure 5:
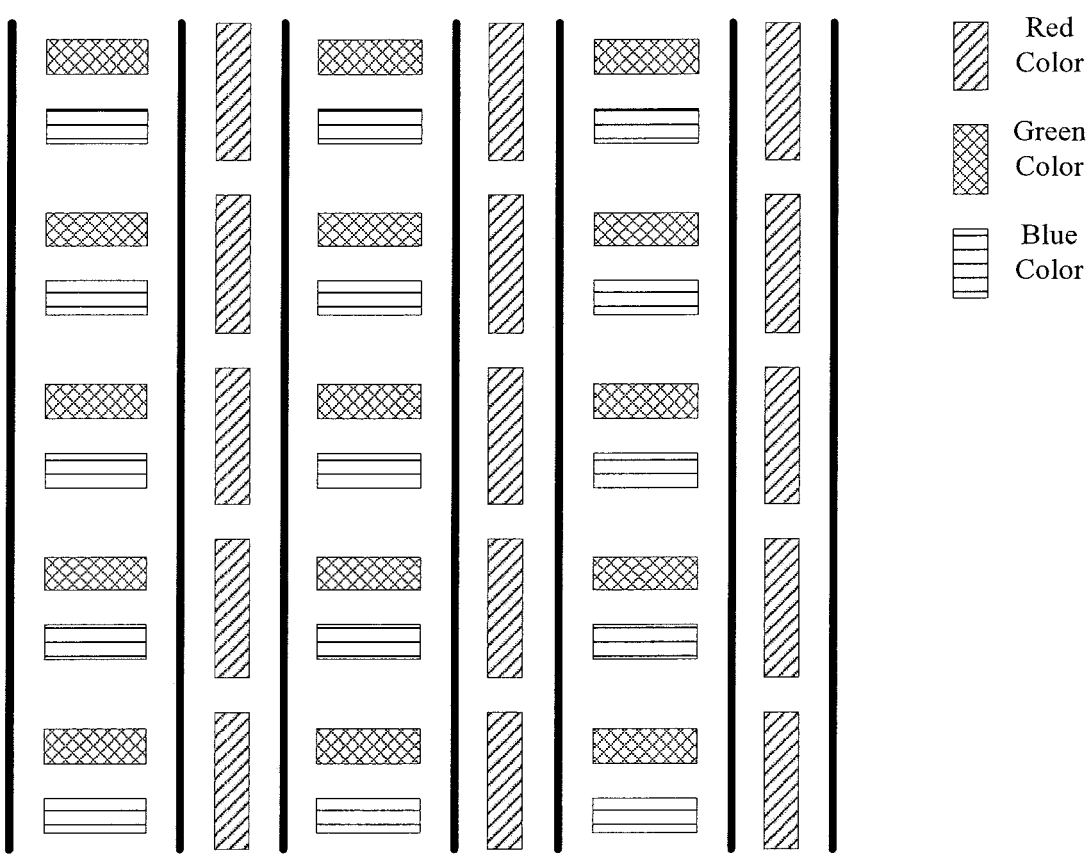
FIG. 5 illustrates a schematic view of a located position of a light-shielding wall, according to an exemplary embodiment of the disclosure.
Figure 6:
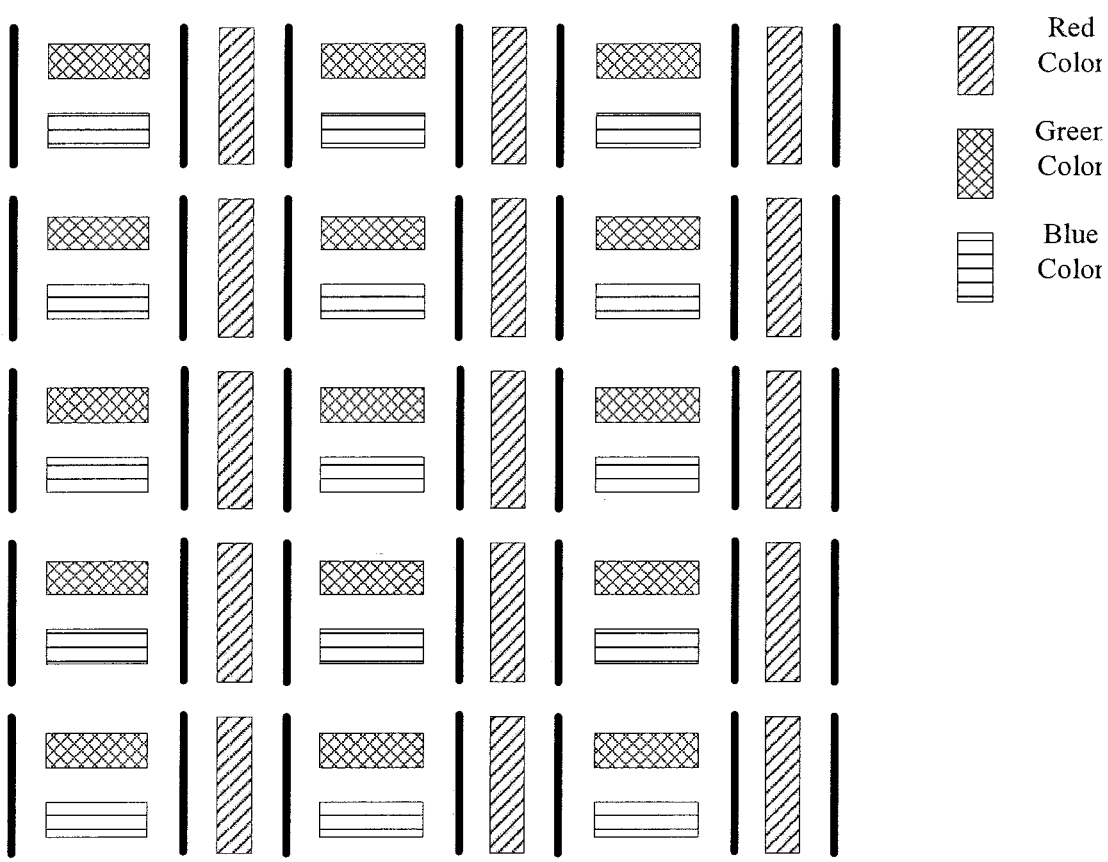
FIG. 6 illustrates a schematic view of a located position of a light-shielding wall, according to an exemplary embodiment of the disclosure.

Taking a pixel array arranged in a S-RGB layout for example, the provided light-shielding wall is illustrated in FIG. 5. Referring to FIG. 5, within the pixel array, a continuous light-shielding wall is provided between any two adjacent columns of sub-pixels and is aligned with one column of the two adjacent columns which is provided with a larger second length of the pixel array. The provided light-shielding wall is also illustrated in FIG. 6. Referring to FIG. 6, within the pixel array, a plurality of light-shielding walls which are arranged to be spaced apart are provided between any two adjacent columns of sub-pixels, each of the light-shielding walls being aligned with sub-pixels which are provided with larger second length(s) within adjacent sub-pixels.

Figure 7:
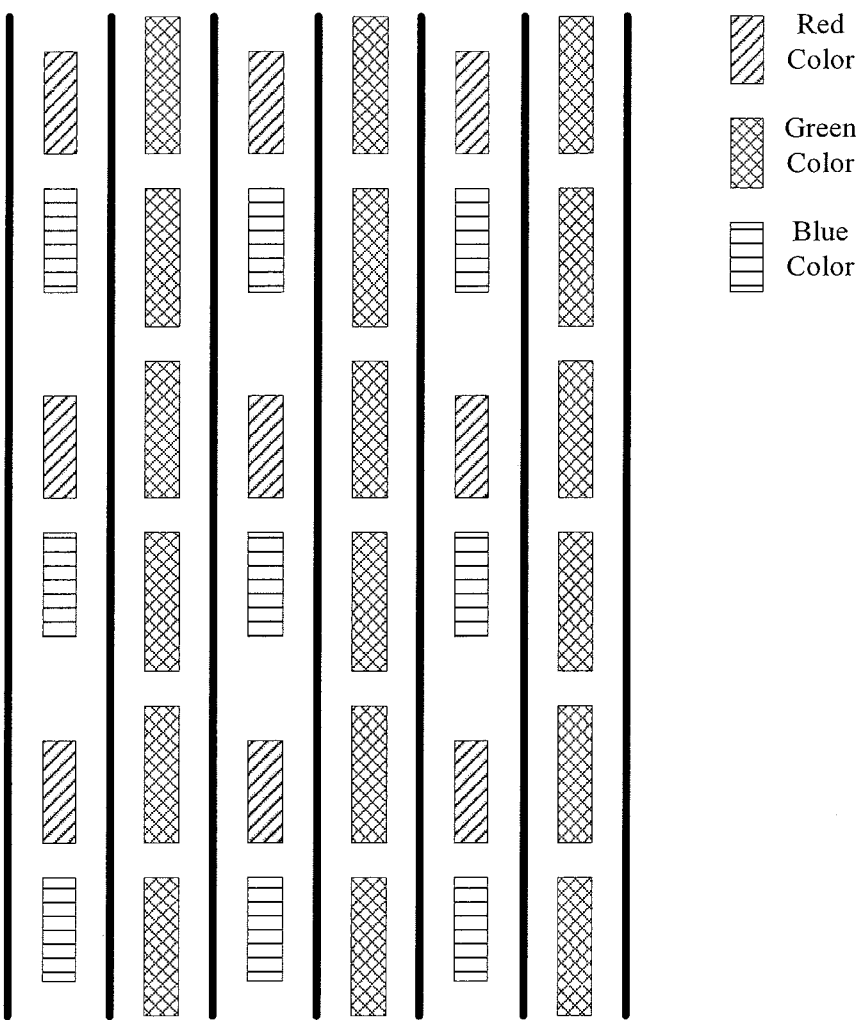
FIG. 7 illustrates a schematic view of a located position of a light-shielding wall, according to an exemplary embodiment of the disclosure.
Figure 8:
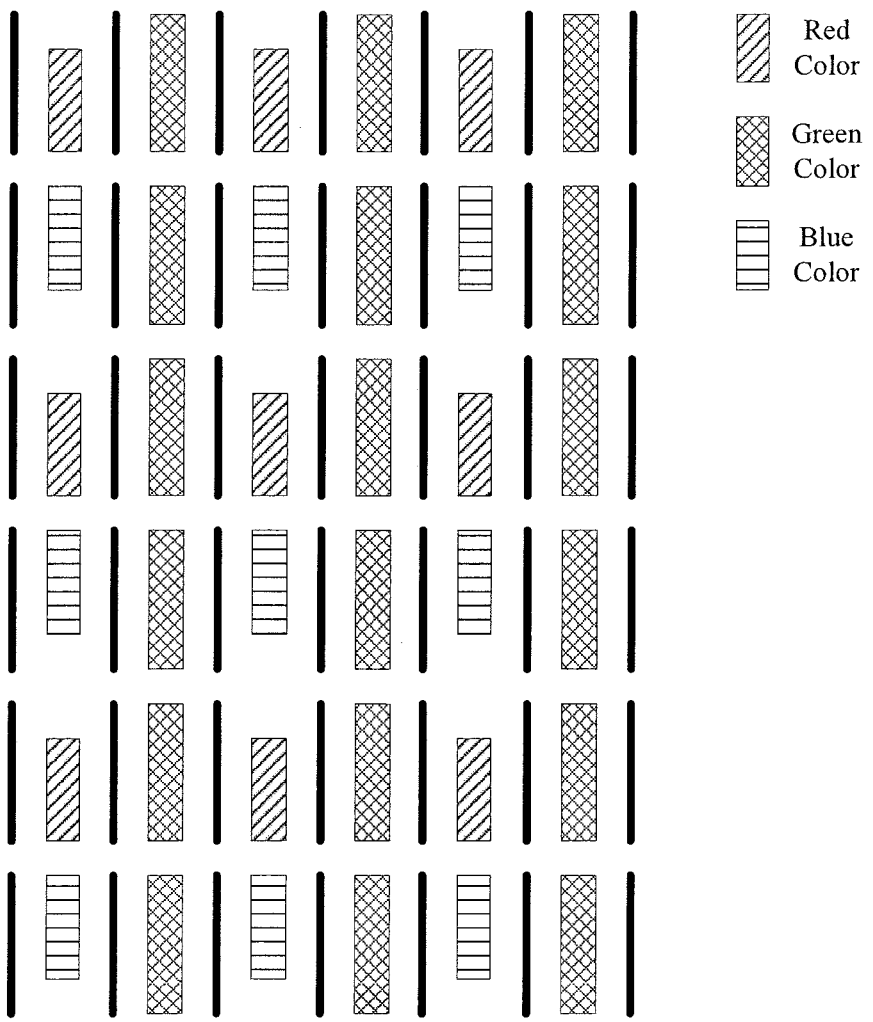
FIG. 8 illustrates a schematic view of a located position of a light-shielding wall, according to an exemplary embodiment of the disclosure.

Taking a pixel array arranged in a Pentile layout for example, the provided light-shielding wall is illustrated in FIG. 7. Referring to FIG. 7, within the pixel array, a continuous light-shielding wall is provided between any two adjacent columns of sub-pixels and is aligned with one column of adjacent columns which is provided with a larger second length of the pixel array. The provided light-shielding wall is also illustrated in FIG. 8. Referring to FIG. 8, within the pixel array, a plurality of light-shielding walls which are arranged to be spaced apart are provided between any two adjacent columns of sub-pixels, each of the light-shielding walls being aligned with sub-pixels which are provided with larger second length(s) within adjacent sub-pixels.

In the case that continuous light-shielding walls are provided on the substrate, each of the continuous light-shielding walls may be formed with only a single step e.g., by a single stage ink-jet printing, facilitating simple printing step and thus enhancing printing efficiency. And in the case that a plurality of light-shielding walls which are configured to be spaced apart are provided onto the substrate, there is no light-shielding wall provided at a position opposite to a void between any two adjacent sub-pixel within a same column any longer, resulting in saving in printing materials A display panel is provided by embodiments of the disclosure, which may achieve a peep-proof aim by providing between any two adjacent columns of sub-pixels within the pixel array a light-shielding wall which is enabled to shield adjacent sub-pixels(s) so as to decrease a visual range of the display panel. And the first length of the light-shielding wall in a direction perpendicular to the substrate is smaller than a spacing between the pixel array substrate and the opposite substrate, such that neither the thickness of the display panel nor that of the display apparatus may be increased by interposing the light-shielding wall within the spacing. Furthermore, luminance of the sub-pixels may not be decreased within an optimal visual angle thereof.

All of above alternative technical solutions may be adopted in any arbitrary combination so as to form alternative embodiments, without repeating related contents herein any more.

A display device is provided by embodiments of the disclosure, which comprises the display panel as mentioned in above embodiments. For example, the display device may be applied to display apparatus such as computer, Television set, Tablet PC and so on, and the exemplary embodiments of the disclosure may not make specific definitions or impose specific restrictions thereon.

A display device is provided by embodiments of the disclosure, which may achieve a peep-proof aim by providing between any two adjacent columns of sub-pixels on the pixel array substrate a light-shielding wall which is enabled to shield adjacent sub-pixels(s) so as to decrease a visual range of the display panel. And the first length of the light-shielding wall in a direction perpendicular to the substrate is smaller than a spacing between the pixel array substrate and the opposite substrate, such that neither the thickness of the display panel nor that of the display apparatus may be increased by interposing the light-shielding wall within the spacing. Furthermore, luminance of the sub-pixels may not be decreased within an optimal visual angle thereof.

It may be appreciated by those skilled that all or part of the steps of above embodiments may be implemented, for example by hardware, or be accomplished by programs implemented in a form of software or firmware for instructing related hardware, and said programs is stored, e.g., on a computer readable storage medium, and aforementioned storage medium may be for example just a read-only memory (ROM), magnetic disc or optical disc.

Various embodiments of the present application have been illustrated progressively, the same or similar parts of which can be referred to each other. The differences between each embodiment and the others are described in emphasis.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments of the general concept of the present application have been shown and described, it would be appreciated by those skilled in the art that various changes or modifications may be made in these embodiments without departing from the principles and spirit of the disclosure, the scope of which is defined in the claims and their equivalents.

It should be noted that the terms, such as "comprising", "including" or "having", should be understood as not excluding other elements or steps and the word "a" or "an" should be understood as not excluding plural of said elements or steps. Further, any reference number in claims should be understood as not limiting the scope of the present application.

What is claimed is:

1. A display panel, wherein the display panel comprises a pixel array substrate and an opposite substrate which is located opposite to the pixel array substrate, the pixel array substrate comprising a pixel array and a substrate on which the pixel array is arranged;

wherein the pixel array comprises a plurality of columns of sub-pixels, a light-shielding wall being provided between any two adjacent columns of sub-pixels; and wherein the substrate in the pixel array substrate is used as a reference; and on the basis of such reference, a direction perpendicular to the plane of the substrate is specified as a first direction, and a length in the first direction is referred to as a first length, and the first length of the light-shielding wall in a direction perpendicular to the substrate is uniform and smaller than a spacing between the pixel array substrate and the opposite substrate;

wherein the first length of the light-shielding wall is larger than a thickness of its adjacent sub-pixel in the direction perpendicular to the substrate;

wherein the light-shielding wall is spaced apart from either of two adjacent columns of sub-pixels in vicinity thereof; and wherein both the light-shielding wall and two adjacent columns of sub-pixels are formed directly on and abutting against a surface of the substrate facing towards the opposite substrate.

2. The display panel according to claim 1, wherein a continuous light-shielding wall is provided as the light-shielding wall which is continuously disposed, between any two adjacent columns of sub-pixels within the pixel array.

3. The display panel according to claim 2, wherein on the basis of the reference, a longitudinal direction in which the substrate extends in the plane thereof is specified as a second direction, and for each continuous light-shielding wall, it is configured to be aligned with a prescribed column within the pixel array which is one column configured to be provided with a larger length in a longitudinal direction of the substrate, within two columns located in vicinity of the light-shielding wall at both sides thereof respectively.

4. The display panel according to claim 1, wherein a plurality of light-shielding walls are provided as light-shielding walls spaced apart, between any two adjacent columns of sub-pixels within the pixel array.

5. The display panel according to claim 4, wherein on the basis of the reference, a longitudinal direction in which the substrate extends in the plane thereof is specified as a second direction, and for each light-shielding wall, it is configured to be aligned with prescribed sub-pixels, which are sub-pixels configured to have a largest length in a longitudinal direction of the substrate, within at least one sub-pixel located at each of both sides in vicinity of the light-shielding wall respectively.

6. The display panel according to claim 1, wherein the first length of the light-shielding wall is configured to be less than 50 um.

7. The display panel according to claim 1, wherein for each light-shielding wall, a spacing of 1 to 25 um is provided between the sub-pixels nearest to the light-shielding wall and the light-shielding wall.

8. The display panel according to claim 1, wherein a thickness of each sub-pixel within the pixel array is configured to be 0.05 to 5 um.

9. The display panel according to claim 1, wherein a third length of each sub-pixel within the pixel array in a transverse direction of the substrate is configured to be 1 to 50 um.

10. The display panel according to claim 1, wherein the light-shielding wall is a Black Matrix wall.

11. The display panel according to claim 1, wherein the light-shielding wall is formed by ink-jet printing onto the substrate.

12. A display device, wherein the display device comprises the display panel according to claim 1.

13. The display panel according to claim 1, wherein the light-shielding wall is provided outside the pixel array.

* * * * *